OCR_NO_TEXT

METHOD OF FABRICATING A SEMICONDUCTOR DEVICE

BACKGROUND

The present invention relates to a method of fabricating a semiconductor device.

Semiconductor chips include contact pads of contact elements on one or more of their surfaces. When fabricating a semiconductor device, in particular when housing the semiconductor chip in a semiconductor chip package, the contact pads of the semiconductor chip have to be connected to external contact elements of the semiconductor chip package. For producing semiconductor devices, a plurality of chips is provided, and the chips are embedded in an encapsulation material to form an embedded substrate. Afterwards the semiconductor chips are separated from each other to obtain a respective plurality of semiconductor devices.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device and the embodiments of a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

The semiconductor chips may become covered with an encapsulant material. The encapsulant material can be any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, fan-out embedded dies can be fabricated. The fan-out embedded dies can be arranged in an array having the form e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Figure 1:
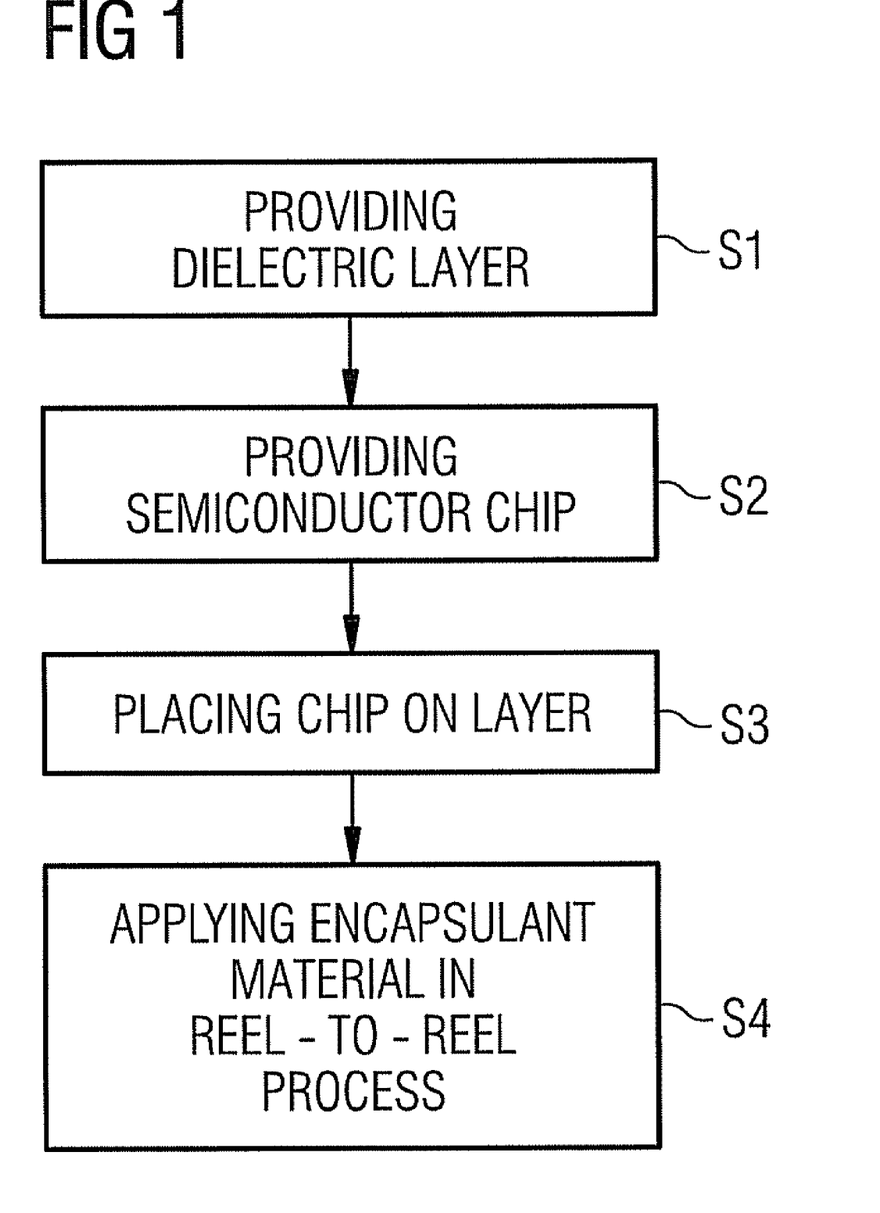
FIG. 1 illustrates a flow diagram of a method of fabricating a semiconductor device according to one embodiment.

Referring to FIG. 1, there is illustrated a flow diagram of a method of fabricating a semiconductor device according to one embodiment. The method includes providing a dielectric layer (s1), providing at least one semiconductor chip defining a first surface including contact elements and a second surface opposite to the first surface (s2), placing the semiconductor chip onto the dielectric layer with the first surface facing the dielectric layer (s3), and applying an encapsulant material over the second surface of the semiconductor chip in a reel-to-reel process (s4).

A reel-to-reel process can be realized by providing a first rotating reel, a in-run reel, a second rotating reel, a out-run reel, and a working zone arranged between the in-run reel and the out-run reel. The in-run reel is arranged to transport the dielectric layer with the applied semiconductor chip to the working zone and the out-run reel is arranged to transport the dielectric layer with the applied semiconductor chip away from the working zone. In the working zone the encapsulant material is applied over the second surface of the semiconductor chip. As mentioned above the measures of the flow diagram can be conducted in another sequence. For example the semiconductor chips can also be attached to the dielectric layer during the reel-to-reel process, in particular within the working zone.

According to one embodiment the method of FIG. 1 further includes applying the dielectric layer to a wheel before applying the encapsulant material. In this embodiment the working zone is arranged at and in the vicinity of the wheel, more specifically at and in the vicinity of a surface region of the wheel along a particular circumferential angular range of the wheel. In the working zone the dielectric layer can be applied to the surface region of the wheel and the encapsulant material can be applied to the second surface of the semiconductor chip in e.g., a dispensing zone. If appropriate a curing process and a planarizing process can also be carried out in the working zone as will be illustrated in further detail below.

According to one embodiment the method of FIG. 1 further includes applying a stencil printed layer, in particular a stencil spacer, onto the dielectric layer and applying the encapsulant material over the second surface of the semiconductor chip by using the stencil spacer. The stencil spacer can be of such a thickness and/or consistency that it fulfils also the function of a stiffener for stiffening the dielectric layer.

According to one embodiment the method of FIG. 1 further includes applying the encapsulant material by use of a squeegee. In particular in this embodiment the applying of a stencil spacer can be useful in addition so that the squeegee can be supported on the stencil spacer. As will be illustrated in further detail below, when using a wheel, e.g., a rotating wheel as working zone, the squeegee can be hold stationary in a dispensing zone and the encapsulant can be dispensed through the squeegee onto the second surface of the semiconductor chip and the dielectric layer which pass along and below a lower opening of the squeegee. The squeegee can be arranged at a particular circumferential position of the wheel.

According to one embodiment the method of FIG. 1 further includes precuring or curing the obtained structure after applying the encapsulant material. In particular when using a as working zone, a curing zone can be provided at a particular circumferential position of the wheel. The curing zone can, for example, be arranged behind the dispensing zone in the direction of rotation of the wheel. Curing can be accomplished by using ultraviolet light in case of an ultraviolet curing encapsulant material or, alternatively, by using infrared light or heat.

According to one embodiment the method of FIG. 1 further includes planarizing the obtained structure after applying the encapsulant material. In particular when using a as working zone, a planarizing zone can be provided at a particular circumferential position of the wheel. The planarizing zone can, for example, be arranged behind the dispensing zone in the direction of transport on the wheel or behind the curing zone, if available.

According to one embodiment the method of FIG. 1 further includes applying the dielectric layer to a planar moving surface before applying the encapsulant material. In this embodiment the working zone is provided by a surface region of the planar moving surface and an environment thereof. The working zone can also include a dispensing zone in which the encapsulant material is dispensed and applied onto the second surface of the semiconductor chip and, if appropriate, a curing zone for precuring or curing the obtained structure after applying the encapsulant material and, if appropriate, a planarizing zone for planarizing the obtained structure.

Figure 2:
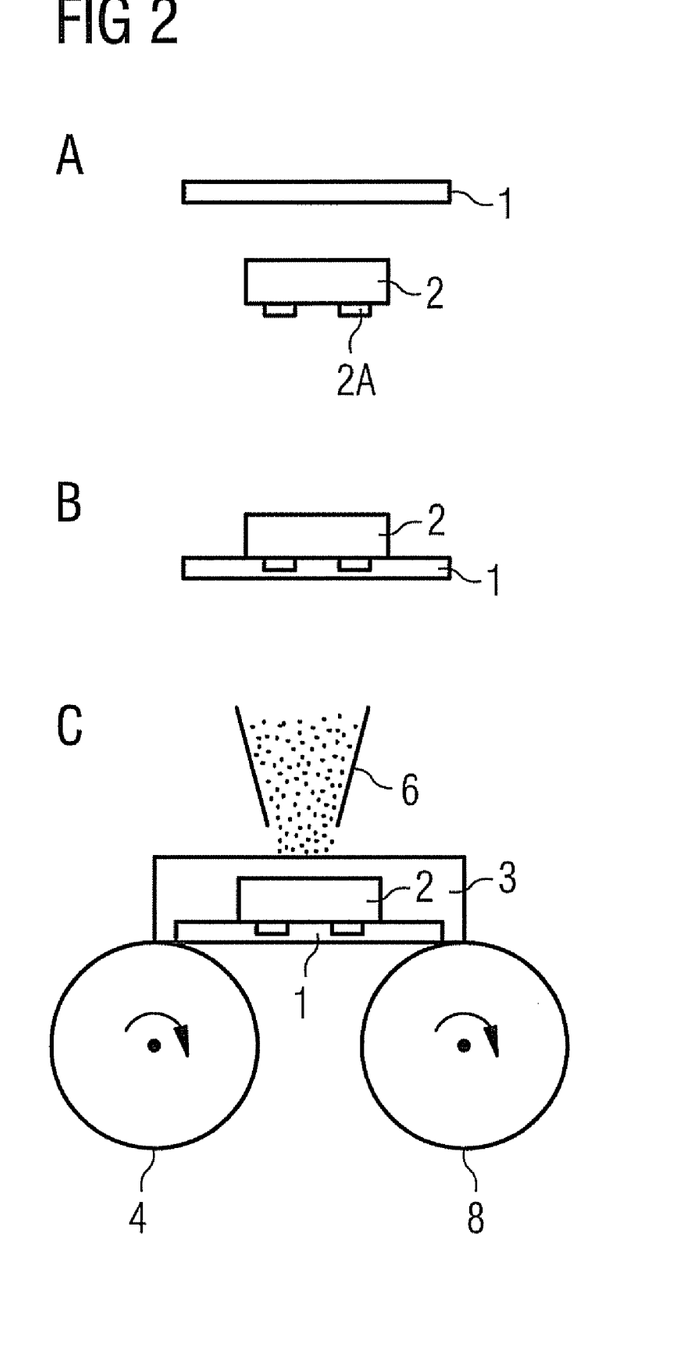
FIGS. 2A-C illustrate schematic cross-sectional representations of intermediate products and a semiconductor device for illustrating one embodiment of a method of fabricating a semiconductor device.

Referring to FIGS. 2A-C, there are illustrated schematic cross-sectional representations for illustrating one embodiment of a method of fabricating a semiconductor device corresponding to the embodiment of FIG. 1. FIG. 2A illustrates in the upper partial picture a cross-sectional representation of a dielectric layer 1. The dielectric layer 1 can be made of a dielectric, insulating material which can, for example, be comprised of a foil based on an acrylate or which can also be an epoxy-bistage foil. The dielectric layer 1 can, for example, also be made of a prepreg (preimpregnated) foil such as that known from conventional substrate technology. The dielectric layer 1, for example, can be comprised of a photo-structurable prepreg which can be etched after lithographical exposure. It is also possible that the dielectric layer 1 is made of a material that can be ablated or structured with a laser beam. The dielectric layer 1 can also include an additive, which releases electrically conducting material or which releases a catalytic layer for plating upon irradiation. The dielectric layer 1 can also have adhesion properties in order to fix semiconductor chips which are to be applied on its surface. If, however, the dielectric layer 1 does not have itself sufficient adhesion force at its surface, a further layer (not illustrated) including an adhesion promoter can be applied to the surface of the dielectric layer 1. The dielectric layer 1 itself can be fixed on a sacrificial carrier liner or carrier layer (not illustrated) giving mechanical rigidness for all the processing measures. The sacrificial carrier layer can finally be simply peeled off.

FIG. 2A also illustrates in the lower partial picture a cross-sectional representation of a semiconductor chip 2 including a first surface having contact elements or contact pads 2A thereon, and a second surface opposite to the first surface. The semiconductor chips to be used here may be of extremely different types and may include integrated electrical or electro-optical circuits. The semiconductor chips may be, for example, configured as power transistors, power diodes, control circuits, micro-processors or micro-electro-mechanical components or discrete passives. The semiconductor chips need not necessarily be manufactured from specific semiconductor material and, furthermore, may contain inorganic and/or organic materials that are not semiconductors, such as, for example, insulators, plastics or metals.

FIG. 2B illustrates a cross-sectional representation of an intermediate product after applying the semiconductor chip 2 to the dielectric layer 1. The semiconductor chip 2 is placed onto the dielectric layer 1 with the first surface of the semiconductor chip 2 facing the dielectric layer 1. It is possible that the dielectric layer 1 has pre-fabricated through-holes (or vias) (not illustrated) and that the semiconductor chip 2 can be placed in such a way onto the dielectric layer 1 that the contact elements 2A of the semiconductor chip 2 are aligned with the through-holes of the dielectric layer 1. The semiconductor chip 2 can be placed by different means onto the dielectric layer 1 wherein, for example, in case of placing a plurality of semiconductor chips 2 onto the dielectric layer 1, a pick-and-place machine can be used. A pattern recognition of the through-holes can be implemented for placing the semiconductor chip in the correct position.

FIG. 2C illustrates a cross-sectional representation of the process of applying an encapsulant material 3 over the semiconductor chip 2. The encapsulant material 3 can, for example, include a molding material wherein the molding technique can be, for example, compression molding. The encapsulant material can also be applied by other process techniques like, for example, screen printing. The encapsulant materials include, for example, aliphatic and aromatic polymers including thermoplastic and thermoset type polymers and blends of these and also other various types of polymers.

A plurality of semiconductor chips 2 is applied onto the dielectric layer 1 and the dielectric layer 1 is supplied to an in-run rotating reel 4. The in-run rotating reel 4 transports the dielectric layer 1 to a working zone. In another embodiment the die bonding is done in the working zone. The working zone also includes a dispenser 6 for dispensing the encapsulant 3 on the second surfaces of the semiconductor chips 2. From the working zone the obtained structure is transported to an out-run rotating reel 8 and the out-run rotating reel 8 outputs the obtained structure, i.e. an array of semiconductor chips 2 applied onto the dielectric layer 1 and encapsulated within the encapsulant 3. The dielectric layer 1 and the encapsulated structure as output by the out-run rotating reel 8 can have the shape of a wafer or a rectangular shape, in particular a rectangular shape having a longitudinal side parallel to the transport direction of the dielectric layer 1 and a lateral side perpendicular to the transport direction of the dielectric layer 1 wherein the longitudinal side is longer than the lateral side, in particular at least 10 times longer than the lateral side or in a further embodiment quasi endless.

After encapsulating and obtaining the encapsulated array further processes will be carried out until the obtained structure can be singulated into single semiconductor devices. According to one embodiment before singulating a conducting layer can be applied over the dielectric layer 1 wherein the conducting layer may include conducting areas which are to be aligned with the through-holes and which can be electrically connected with the contact elements of the semiconductor chips by filling electrically conductive material into the through-holes. The conducting layer may include the function of a redistribution layer for redistributing the arrangement of the contact elements over a larger area. As was described above, the through-holes can be pre-fabricated in the dielectric layer 1 or they can be produced in a later process before the redistribution process. Furthermore by forming vias in the encapsulant a redistribution layer on the surface of the encapsulant might be applied.

According to one embodiment of the method of fabricating a semiconductor device, the method further includes applying solder balls or solderable lands and electrically connecting the solder balls with the conductive areas of the conductive layer and thus with the contact elements of the semiconductor chip. According to one embodiment thereof, the method further includes applying a solder resist layer, the solder resist layer including openings wherein the solder balls are applied above the openings of the solder resist layer.

Typical values of the thicknesses of the layers may be as follows. The thickness of the dielectric layer 1 typically ranges from 5 μm to 150 μm, whereas the thickness of the semiconductor chip 2 typically ranges from 20 μm to 450 μm, and the thickness of the encapsulant material typically ranges from 200 μm to 800 μm. All these thickness ranges also cover incremental values wherein the increment is 1 μm.

Figure 3:
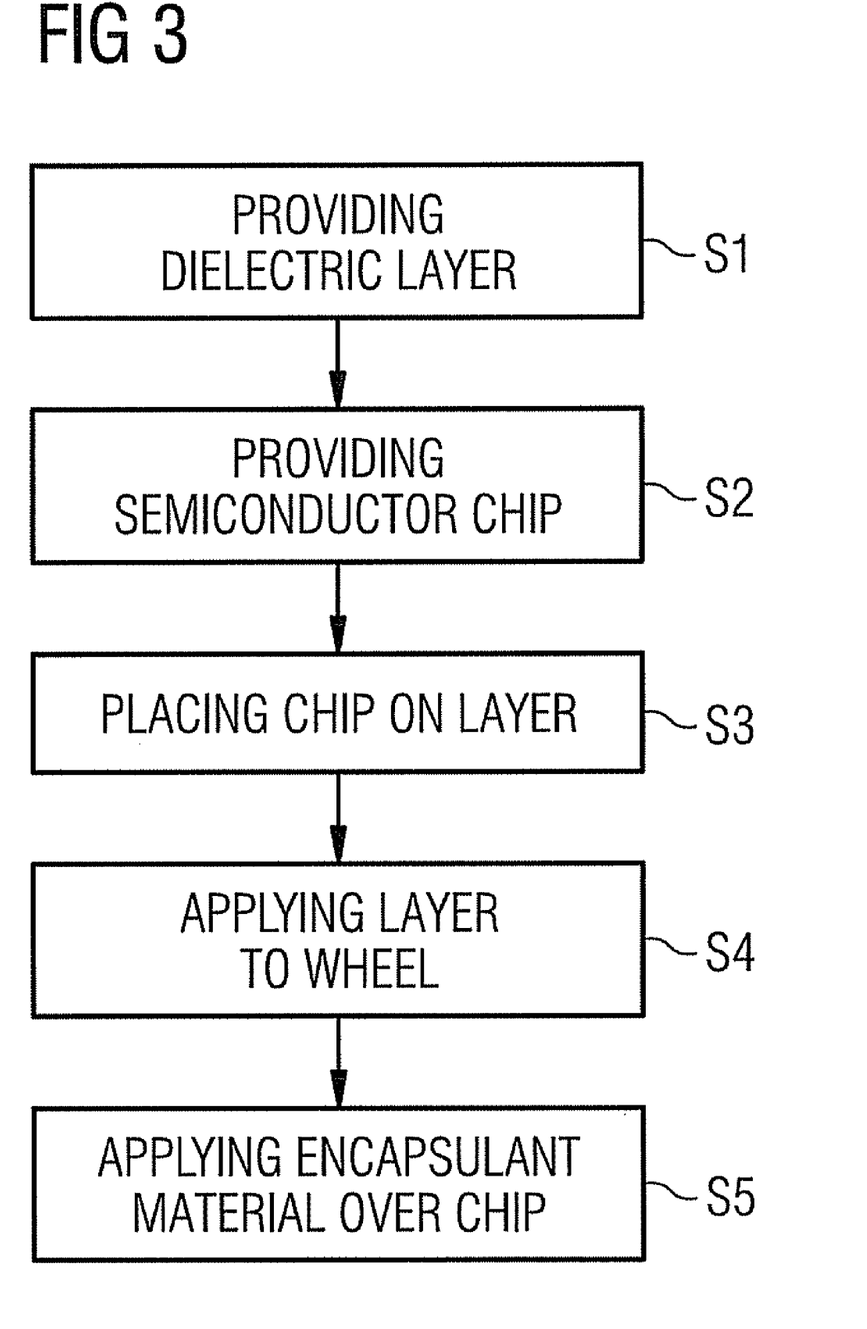
FIG. 3 illustrates a flow diagram of a method of fabricating a semiconductor device according to one embodiment.
Figure 4:
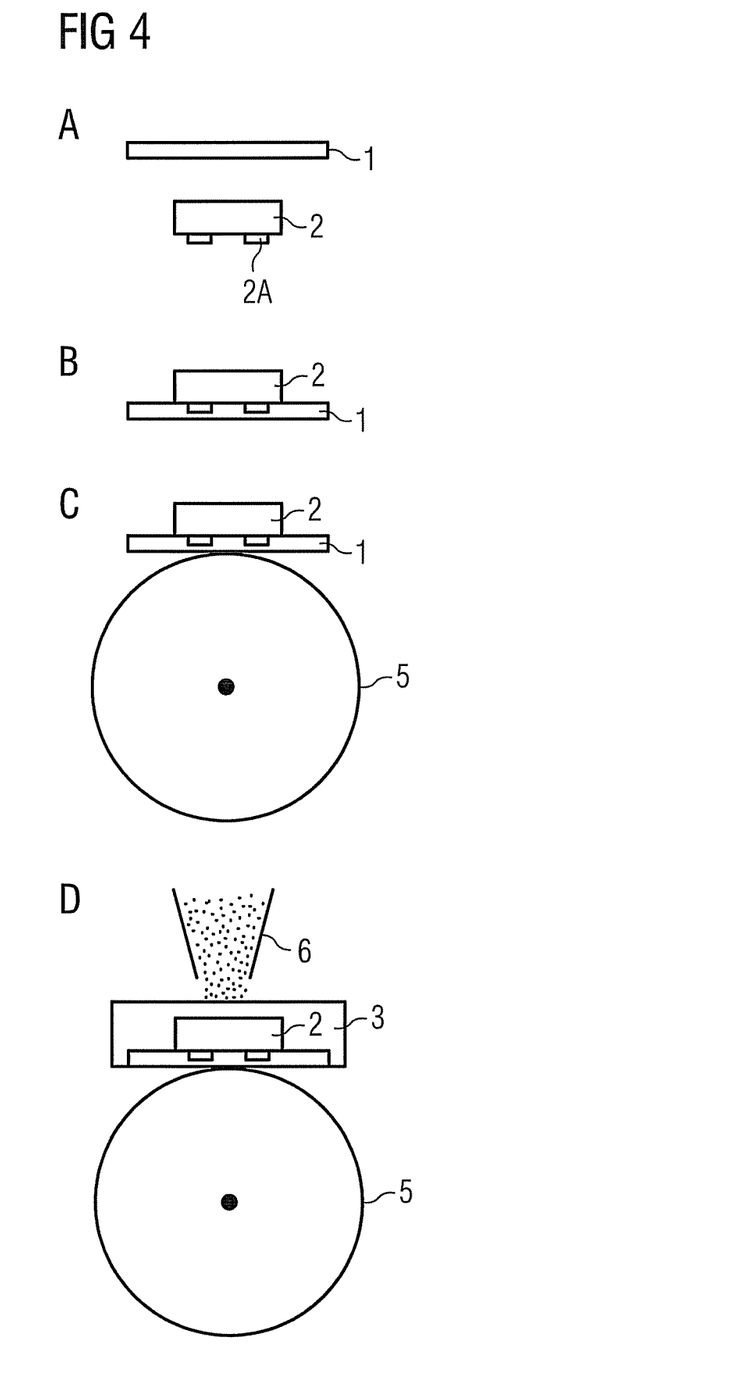
FIGS. 4A-D illustrate schematic cross-sectional representations of intermediate products and a semiconductor device for illustrating one embodiment of a method of fabricating a semiconductor device.

Referring to FIG. 3, there is illustrated a flow diagram of a method of fabricating a semiconductor device according to one embodiment. The method includes providing a dielectric layer (s1), providing at least one semiconductor chip defining a first surface including contact elements and a second surface opposite to the first surface (s2), placing the semiconductor chip onto the dielectric layer with the first surface facing the dielectric layer (s3), applying the dielectric layer to a wheel (s4), and applying an encapsulant material over the second surface of the semiconductor chip (s5).

According to one embodiment the method of FIG. 3 further includes applying a stencil spacer onto the dielectric layer, and applying the encapsulant material over the second surface of the semiconductor chip by using a stencil printing process.

According to one embodiment the method of FIG. 3 further includes applying the encapsulant material by use of a squeegee.

According to one embodiment the method of FIG. 3 further includes precuring or curing of the obtained structure after applying the encapsulant material.

According to one embodiment the method of FIG. 3 further includes planarizing the obtained structure after applying the encapsulant material.

Referring to FIGS. 4A-D, there are illustrated schematic cross-sectional representations for illustrating one embodiment of a method of fabricating a semiconductor device corresponding to the embodiment of FIG. 3. With respect to FIGS. 4A,B reference is made to FIGS. 2A,B and the respective description thereof.

FIG. 4C,D illustrate cross-sectional representations of applying the structure consisting of the semiconductor chip 2 and the dielectric layer 1 on a wheel 5, e.g., a rotating wheel (FIG. 4C) and applying an encapsulant material 3 over the semiconductor chip 2 (FIG. 4D). The encapsulant material 3 can, for example, include a molding material wherein the molding technique can be, for example, compression molding or powder molding. The encapsulant material can also be applied by other process techniques like, for example, screen or stencil printing. The encapsulant materials include, for example, aliphatic and aromatic polymers including thermoplastic and thermoset type polymers and blends of these and also other various types of polymers.

A plurality of semiconductor chips 2 is applied onto the dielectric layer 1 and the dielectric layer 1 is supplied to a wheel 5 and applied to a portion of a surface thereof. The wheel 5 transports the dielectric layer 1 to a working zone which is arranged at and in the vicinity of a surface region of the wheel 5 along a particular circumferential angular range of the wheel 5. The working zone includes a dispenser 6 for dispensing the encapsulant 3 on the second surfaces of the semiconductor chips 2. At the end of the working zone the obtained structure is output, wherein the obtained structure is comprised of an array of semiconductor chips 2 applied onto the dielectric layer 1 and encapsulated within the encapsulant 3.

Further embodiments of the method according to FIGS. 3 and 4A-D can be provided by combining the above with additional aspects or features of embodiments as were described above in connection with FIGS. 1 and 2A-D.

Figure 5:
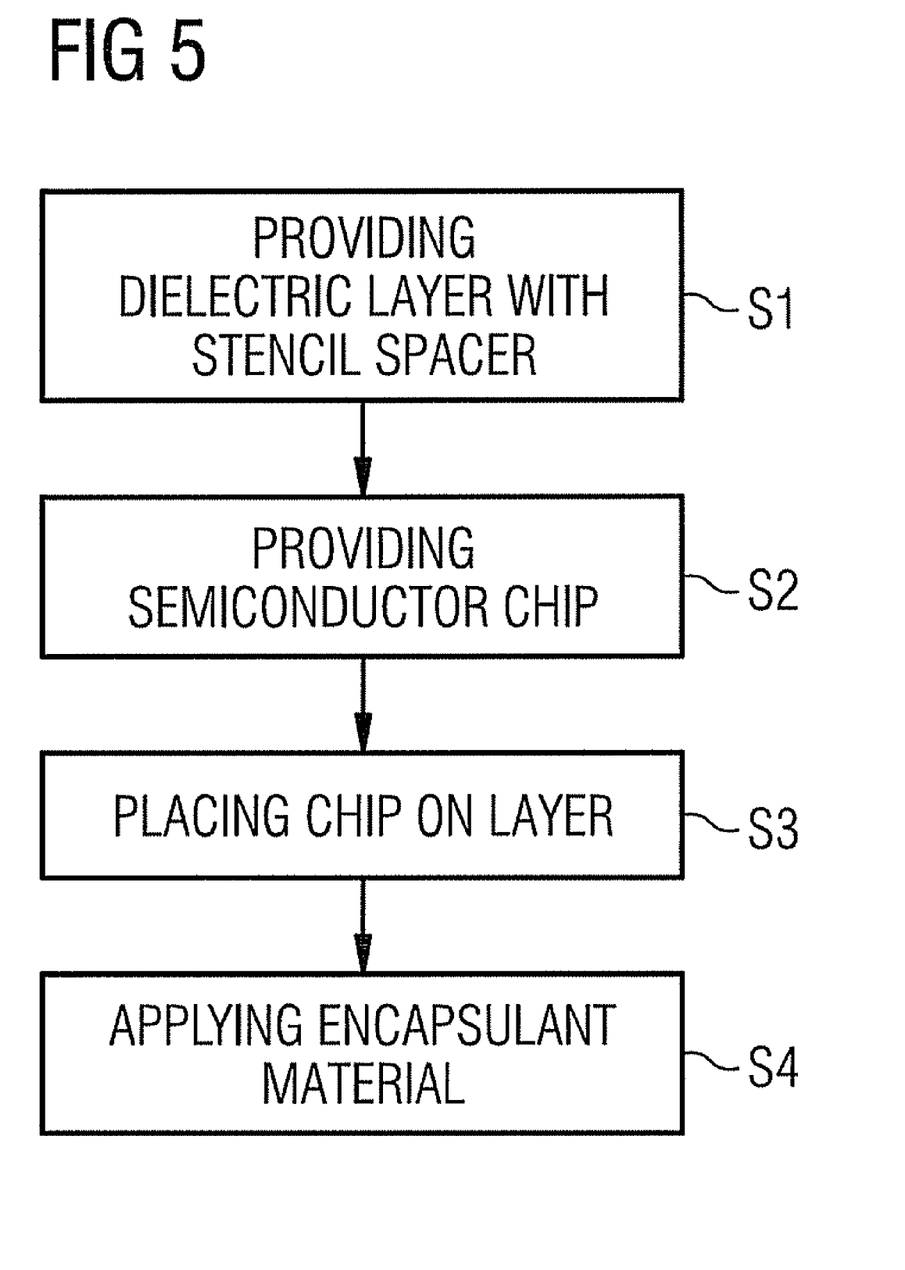
FIG. 5 illustrates a flow diagram of a method of fabricating a semiconductor device according to one embodiment.

Referring to FIG. 5, there is illustrated a flow diagram of a method of fabricating a semiconductor device according to one embodiment. The method includes providing a dielectric layer applied with a stencil spacer (s1), providing at least one semiconductor chip defining a first surface including contact elements and a second surface opposite to the first surface (s2), placing the semiconductor chip onto the dielectric layer with the first surface facing the dielectric layer (s3), and applying an encapsulant material over the second surface of the semiconductor chip by using the stencil spacer for planarizing the encapsulant material (s4).

According to one embodiment the method of FIG. 5 further includes precuring or curing the obtained structure after applying the encapsulant material.

According to one embodiment the method of FIG. 5 further includes planarizing the obtained structure after applying the encapsulant material.

According to one embodiment the method of FIG. 5 further includes applying the encapsulant material over the second surface of the semiconductor chip in a reel-to-reel process.

According to one embodiment the method of FIG. 5 further includes applying the dielectric layer to a wheel before applying the encapsulant material.

According to one embodiment the method of FIG. 5 further includes applying the encapsulant material by use of a squeegee.

According to one embodiment the stencil layer is not applied to the dielectric layer from the beginning but is rather applied to the dielectric layer as a sidewall layer simultaneously with encapsulating. In particular the sidewall layer can be applied to the dielectric layer as mold foil. More specifically it can be applied to the dielectric layer by using a reel-to-reel process.

Figure 6:
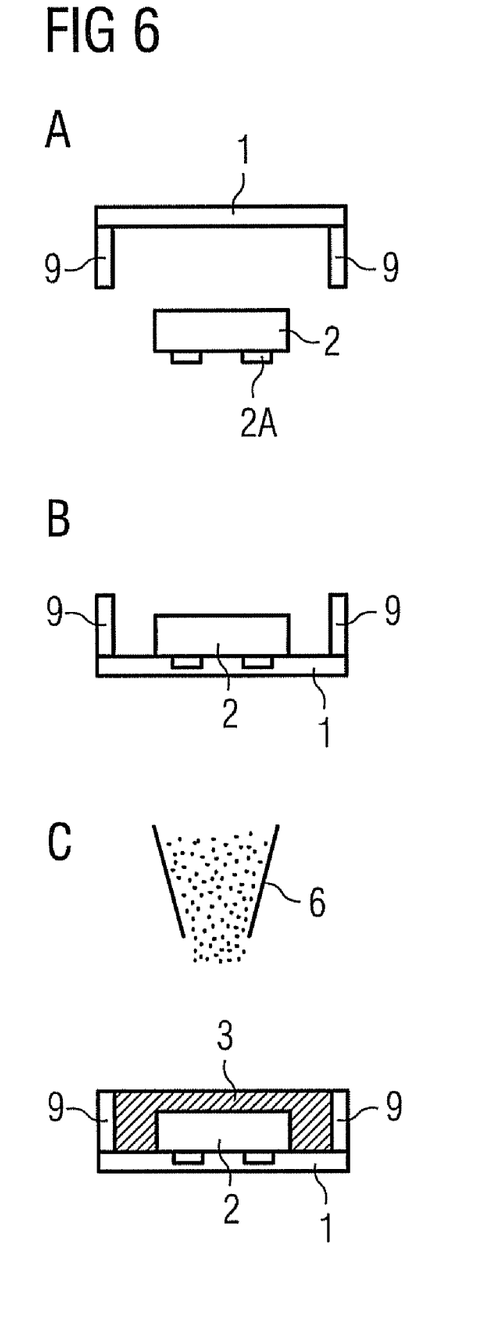
FIGS. 6A-C illustrate schematic cross-sectional representations of intermediate products and a semiconductor device for illustrating one embodiment of a method of fabricating a semiconductor device.

Referring to FIGS. 6A-C, there are illustrated schematic cross-sectional representations for illustrating one embodiment of a method of fabricating a semiconductor device corresponding to the embodiment of FIG. 5. With respect to FIGS. 6A,B reference is made to FIGS. 2A,B and the respective description thereof. In addition the dielectric layer 1 is provided with a stencil spacer 9 applied thereon. FIG. 6A (upper part) illustrates a lateral cross-sectional representation of the dielectric layer 1 and the stencil spacer 9 applied thereon. As illustrated the stencil spacer 9 can be deposited in the form of two strips applied along the two opposing longitudinal side edges of the dielectric layer 1, i.e. along side edges parallel to a direction of feeding the dielectric layer 1 to a dispenser 6 for applying an encapsulant material 3 over the semiconductor chip 2.

The height of the stencil spacer 9 determines and limits the thickness of the encapsulant layer to be deposited. In the embodiment of FIG. 6B the stencil spacer 9 is illustrated to have a height greater than the thickness of the semiconductor chip 2 which means that the encapsulant layer to be deposited will have a thickness greater than the thickness of the semiconductor chip 2. Depositing of the encapsulant can be accomplished by using a squeegee whereas the stencil spacer 9 can serve as a mechanical support for the squeegee during the deposition process.

FIG. 6C illustrates a lateral cross-sectional representation of an intermediate product after applying of an encapsulant material 3 on the semiconductor chip 2 and the dielectric layer 1. It can be seen that the thickness of the deposited encapsulant material layer 3 corresponds to the height of the stencil spacer 9. Thereafter the stencil spacer 9 can be removed, if appropriate.

Further embodiments of the method according to FIGS. 5 and 6A-C can be provided by combining the above with additional aspects or features of embodiments as were described above in connection with FIGS. 1 to 4.

Figure 7:
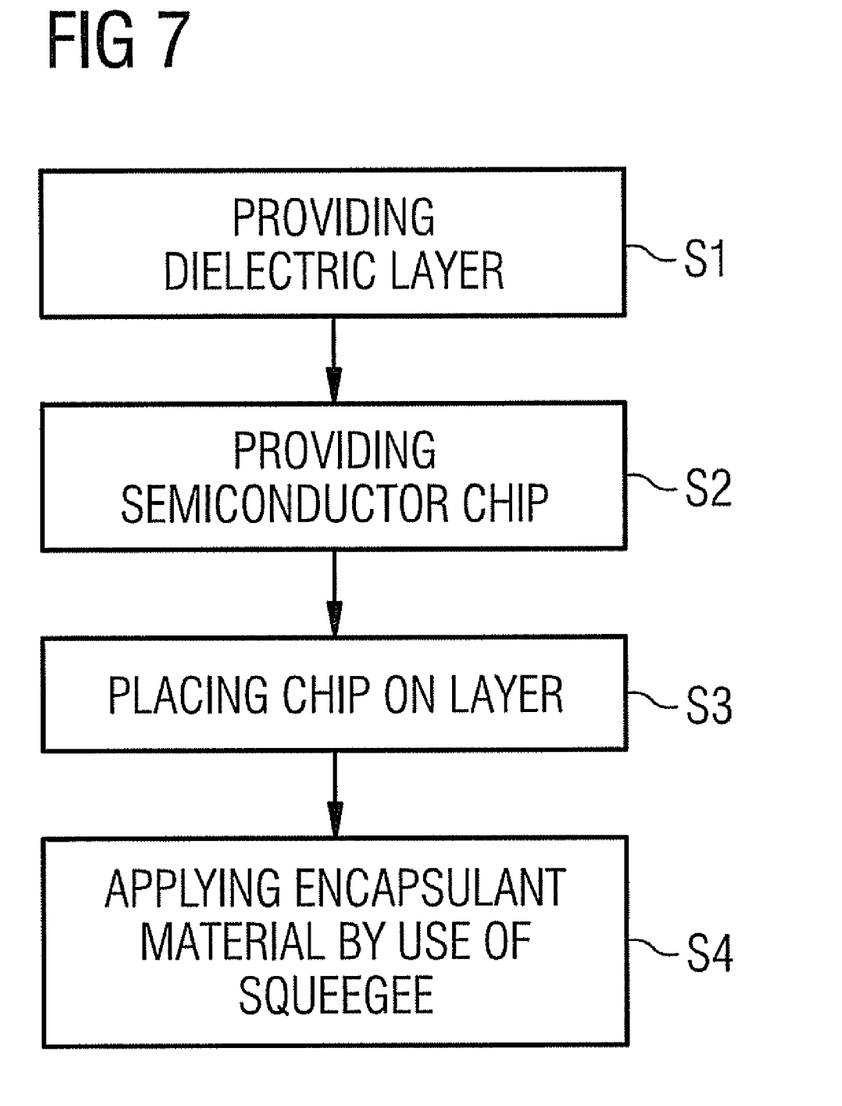
FIG. 7 illustrates a flow diagram of a method of fabricating a semiconductor device according to one embodiment.

Referring to FIG. 7, there is illustrated a flow diagram of a method of fabricating a semiconductor device according to one embodiment. The method includes providing a dielectric layer (s1), providing at least one semiconductor chip defining a first surface including contact elements and a second surface opposite to the first surface (s2), placing the semiconductor chip onto the dielectric layer with the first surface facing the dielectric layer (s3), and applying an encapsulant material over the second surface of the semiconductor chip by use of a squeegee (s4).

According to one embodiment the method of FIG. 7 further includes applying a stencil spacer onto the dielectric layer.

According to one embodiment the method of FIG. 7 further includes curing the obtained structure after applying the encapsulant material.

According to one embodiment the method of FIG. 7 further includes planarizing the obtained structure after applying the encapsulant material.

According to one embodiment the method of FIG. 7 further includes applying the encapsulant material over the second surface of the semiconductor chip in a reel-to-reel process.

According to one embodiment the method of FIG. 7 further includes applying the dielectric layer to a wheel before applying the encapsulant material.

Figure 8:
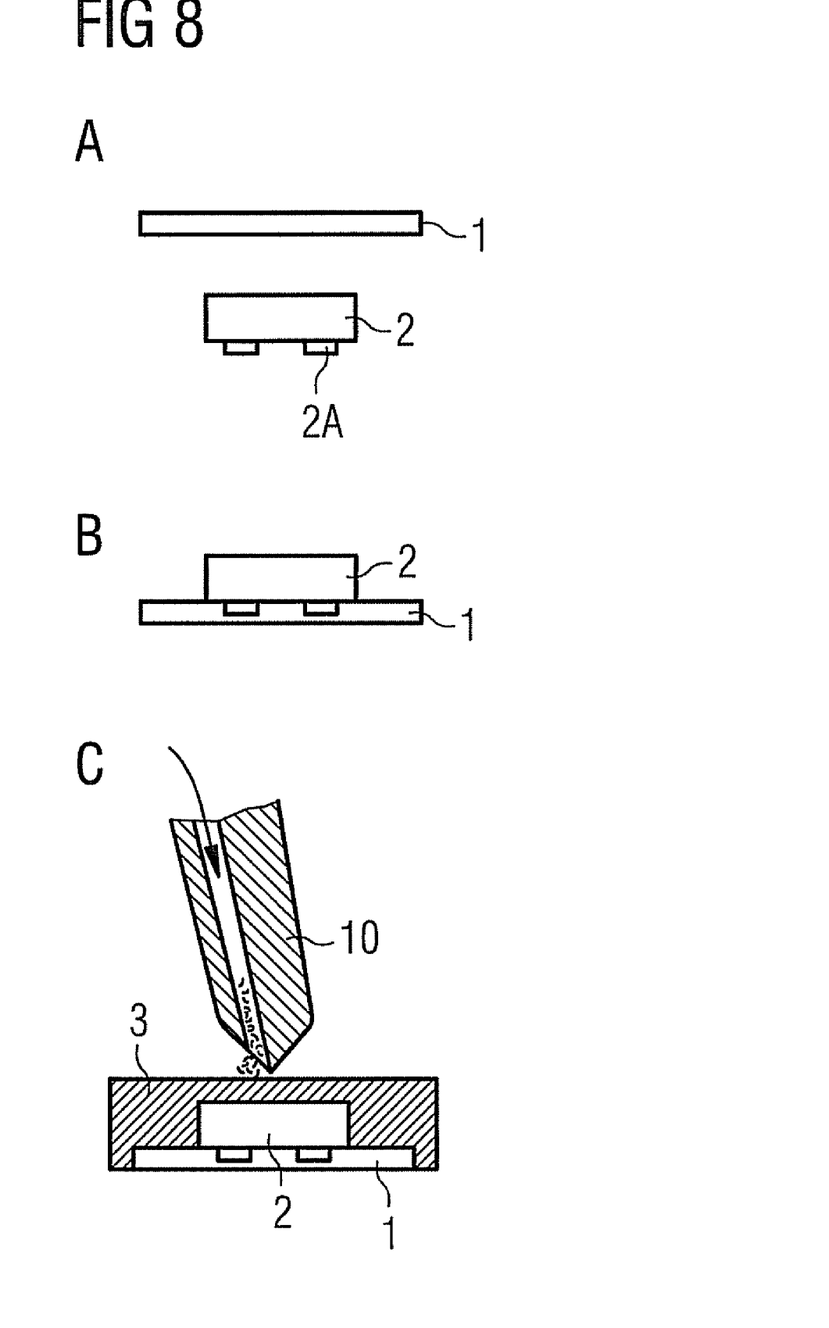
FIGS. 8A-C illustrate schematic cross-sectional representations of intermediate products and a semiconductor device for illustrating one embodiment of a method of fabricating a semiconductor device.

Referring to FIGS. 8A-C, there are illustrated schematic cross-sectional representations for illustrating one embodiment of a method of fabricating a semiconductor device. With respect to FIGS. 8A,B reference is made to FIGS. 2A,B and the respective description thereof.

FIG. 8C illustrates a cross-sectional representation of applying an encapsulant material 3 over the semiconductor chip 2. The encapsulant material 3 is applied by use of a squeegee 10 as a dispenser of the encapsulant material 3. The squeegee 10 can, for example, be supported on a stencil spacer (not illustrated) as outlined in the previous embodiment.

Further embodiments of the method according to FIGS. 7 and 8A-C can be provided by combining the above with additional aspects or features of embodiments as were described above in connection with FIGS. 1 to 6.

Figure 9:
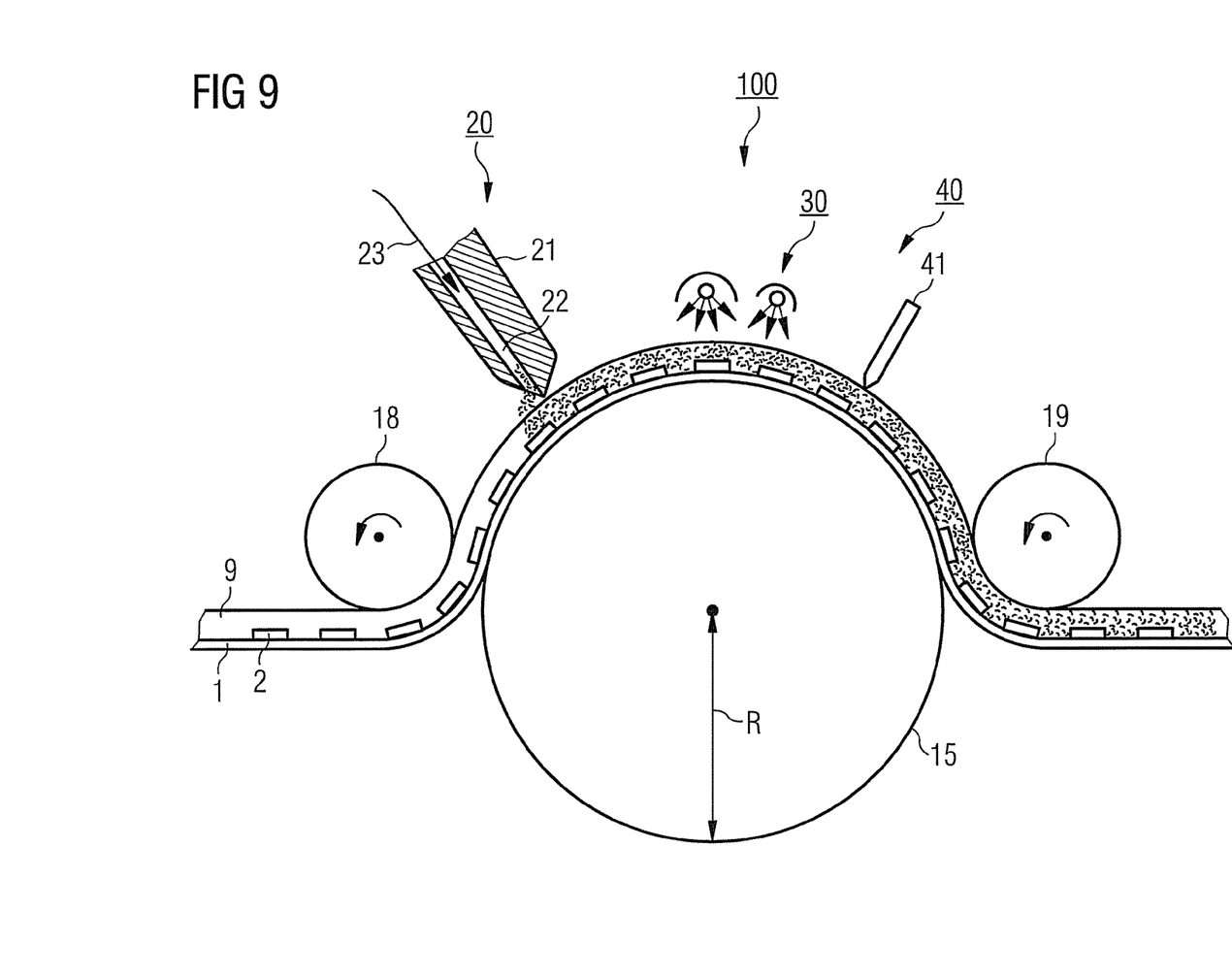
FIG. 9 illustrate a schematic cross-sectional representation of an apparatus for carrying out a method of fabricating a semiconductor device according to one embodiment.

Referring to FIG. 9 there is illustrated a schematic cross-sectional representation of an apparatus for carrying out a method of fabricating a semiconductor device according to one embodiment. The apparatus 100 includes a wheel 15 of radius R arranged between a first rotating reel (in-run reel) 18 and a second rotating reel (out-run reel) 19. The wheel 15 can be formed as a massive cylinder or it can alternatively be formed as a hollow cylinder so that suitable heating means can be arranged in the inner hollow space of the cylinder. The upper surface of the wheel 15 and the region above the upper surface form a working zone in which a fed in layered structure can be processed in a predetermined manner. From the left side a layered structure can be fed into the apparatus 100 to be processed in a manner described further below.

The layered structure fed into the apparatus 100 can have a form like that illustrated in FIG. 6B, which consists of a dielectric layer 1 with a plurality of semiconductor chips 2 applied thereon and a stencil spacer 9 in the form of strip layers applied on longitudinal edge portions of the dielectric layer 1 and/or on a carrier liner (not illustrated) supporting the dielectric layer 1. As the dielectric layer 1 can be in the form of a thin flexible foil, the stencil spacer 9 in addition acts as a stiffener giving the layered structure hold and stability. When such a layered structure is fed into the inner space between the first rotating reel 18 and the wheel 15, the layered structure is gripped and pulled onto the upper surface of the wheel 15.

The working zone of the apparatus 100 may include a first zone for semiconductor chip placement in case that the chips were not yet applied to the dielectric layer 1. The working further includes a dispensing zone 20 for dispensing an encapsulant onto the second upper surfaces of the semiconductor chips 2 and the dielectric layer 1. The dispensing zone 20 can include a stationary squeegee 21 being positioned such that a front edge thereof rests on the stencil spacer 9 of the layered structure. The squeegee 21 includes a dispense channel 22 for delivering the encapsulant material 23 at a lower opening of the dispense channel 22. Thus the squeegee 21 distributes the encapsulant 23 and the thickness of the encapsulant layer is defined by the position of the squeegee 21 which itself is defined by the height of the stencil spacer 9 supporting the squeegee 21.

The working zone of the apparatus 100 further includes a curing zone 30 for precuring/curing or hardening the encapsulant 3. The curing zone 30 is arranged at a circumferential position behind the dispensing zone 20 in the transport direction of the wheel 15. The curing zone 30 can include a conventional tunnel oven or an IR oven. In case of using an UV curing encapsulant the curing zone 30 can include one or more UV light sources.

The working zone of the apparatus 100 might further include a planarizing zone 40 for planarizing the encapsulated structure. The planarizing zone 40 can include a knife, a knife-edge 41 or a grinding wheel arranged laterally with respect to the encapsulated structure and having a length equal to or greater than the lateral width of the encapsulated structure. Alternatively the upper surface of the structure can be grinded or polished in a separate process after being output from the apparatus 100.

The layered structure is output by a second rotating reel 19 (out-run reel). In the described embodiment the encapsulated product has a quasi endless form or an intermediate rectangular form having a longitudinal side which is considerably longer than the lateral side, in particular a factor of 10 or more longer than the lateral side. After releasing the encapsulated product from the apparatus 100, some more processes will be carried out like depositing a redistribution layer/layers on the backside of the dielectric layer 1, connecting conductive areas of the redistribution layer with contact pads of the semiconductor chips and applying a solder resist layer and solder balls electrically connected with the conductive areas of the redistribution layer. Furthermore through encapsulant vias, a redistribution layer/layers on the surface of the encapsulant might be applied. Additional solder ball or lands might be applied on the encapsulant side. At the end the panel will be singulated into a plurality of semiconductor package devices.

The wheel 15 can be a rotating wheel or a stationary wheel or a stationary or moving substrate block (with e.g., different curvatures in transport direction or perpendicular to the transport direction at different working stations) wherein the layered structure is slidingly moved over the surface. In the case of a stationary block the surface might be also planar (R=∞) and the zones, namely the dispensing zone, the curing zone and the planarizing zone are arranged linearly. In the case of curvatures it is also possible to select the radius R in a way that possible warpage of the layered structure can be compensated in an optimal way. Warpage can occur when different components of the layered structure, for example the dielectric layer 1 and the semiconductor chips have different thermal expansion coefficients or when the encapsulant illustrates a particular shrinkage when curing. In this respect it is also possible theoretically to provide for an upward curvature of the wheel in order to compensate for possible warpage or shrinkage effects of the layered structure. This upward curvature will then be taken into account in the design of the squeegee so that a desired height of the semiconductor package can be obtained.

The wheel 15 can also be replaced/covered by an endless circulating belt, in particular a belt fabricated by stainless steel to avoid relative motion between the structured layers and the wheel.

Figure 10:
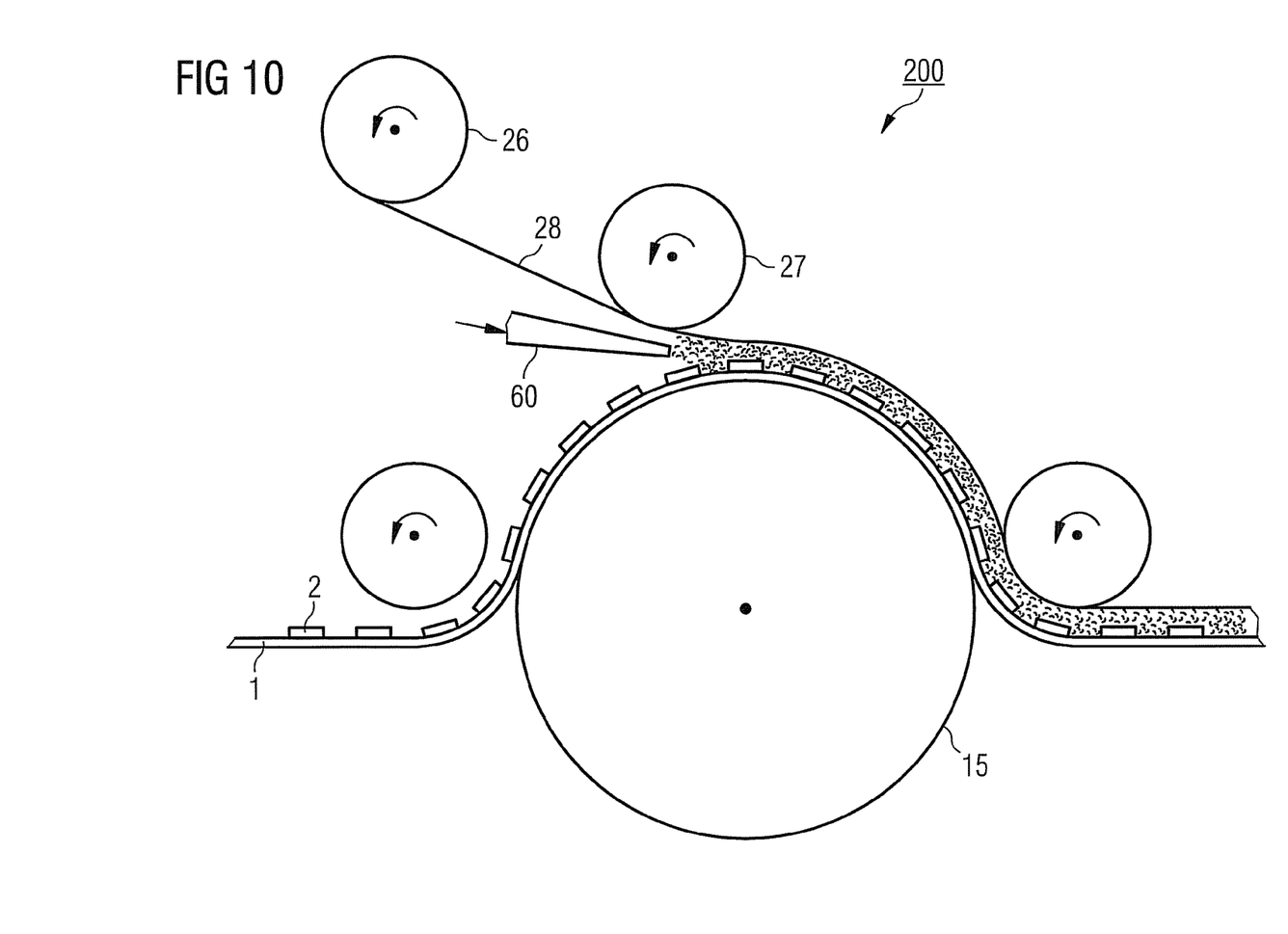
FIG. 10 illustrate a schematic cross-sectional representation of an apparatus for carrying out a method of fabricating a semiconductor device according to one embodiment.

Referring to FIG. 10 there is illustrated a method of fabricating a semiconductor device according to one embodiment. This method includes providing a dielectric layer, providing at least one semiconductor chip defining a first surface including contact elements and a second surface opposite to the first surface, placing the semiconductor chip onto the dielectric layer with the first surface facing the dielectric layer;

applying a sidewall layer onto the dielectric layer, and applying an encapsulant material over the second surface of the semiconductor chip.

In the embodiment illustrated in FIG. 10, an apparatus 200 is arranged such that the stencil spacer is applied to the dielectric layer virtually simultaneously with the applying of the encapsulant. To this purpose two additional rotating reels 26 and 27 are provided for feeding a foil 28, in particular a mold foil, to the wheel 15. The foil 28 can be formed with side strips as illustrated in cross section in FIGS. 6A-C including substantially two strips to be applied such that they extend along the longitudinal side edges of the dielectric layer 1 to prevent a lateral outflow of the encapsulant. Within the foil 28 the longitudinal strips can be interconnected by lateral bars or tape/tapes. The mold foil 28 can be removed later, e.g., after the precuring/curing process or it can also be retained as part of the final semiconductor package.

A dispenser 60 is provided to dispense the encapsulant onto the dielectric layer 1 and the semiconductor chips. The dispenser 60 is directed substantially to the location where the foil is deposited to the dielectric layer 1. Lateral outflow of the encapsulant is prevented by the side strips of the foil 28. The height of the encapsulant layer is determined by the position of the rotating reel 27 and its distance to the wheel 15. In case of the dielectric layer having the stencil spacer a simple planar foil 28 might be used. Instead of dispensing the encapsulant a laminate of an encapsulant material can also be deposited onto the dielectric layer 1 whereas in addition an adhesion promoter could be applied to improve the adhering of the laminate to the dielectric layer 1 and the semiconductor chips 2.

Figure 11:
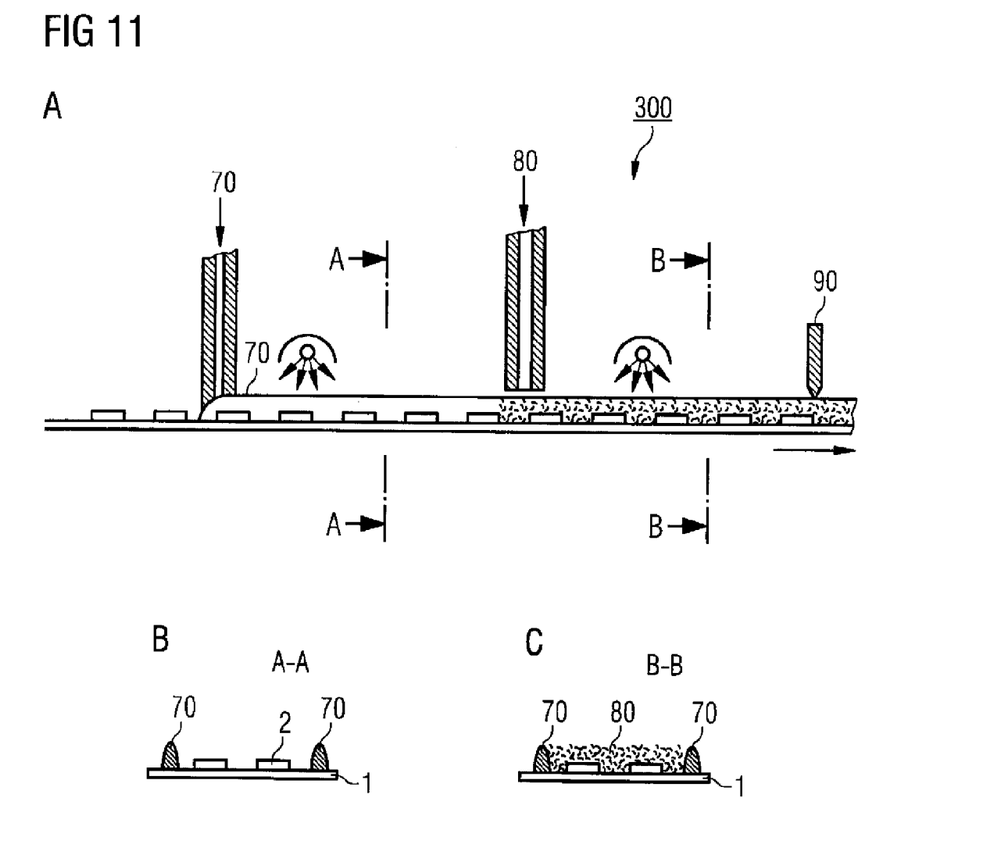
FIG. 11A-C illustrate a schematic cross-sectional representation of an apparatus for carrying out a method of fabricating a semiconductor device according to one embodiment.

Referring to FIGS. 11A-C there is illustrated a method of fabricating a semiconductor device according to one embodiment. Such method of fabricating a semiconductor device includes providing a dielectric layer, providing at least one semiconductor chip defining a first surface including contact elements and a second surface opposite to the first surface, placing the semiconductor chip onto the dielectric layer with the first surface facing the dielectric layer, applying a dam onto the dielectric layer, and applying an encapsulant material over the second surface of the semiconductor chip.

FIG. 11A illustrates a schematic cross-sectional representation of one embodiment of an apparatus for carrying out the method. For simplicity in the embodiment as illustrated in FIG. 11A all stations are depicted in a line. In this embodiment the apparatus 300 is arranged such that at first a dam 70 is applied onto the dielectric layer 1 and cured afterwards, e.g., by UV exposure in case of an UV curing material used as material for the dam. The dam 70 prevents lateral outflow of the encapsulant applied later onto the dielectric layer 1. FIG. 11B depicts a sectional view at the line A-A showing the dielectric layer 1, the semiconductor chips 2 and the dam 70 formed of two strips deposited at the longitudinal side edges of the dielectric layer 1. Then the encapsulant material is dispensed and filled into the space formed by the dielectric layer 1 and the dam 70. FIG. 11C depicts a sectional view at the line B-B showing the dielectric layer 1, the semiconductor chips 2, the dam 70 and the encapsulant 80. The exact thickness or height of the encapsulant can be adjusted in a following planarizing process, e.g., by using a knife, a knife-edge 90 or grinding wheel, or alternatively in a polishing or grinding process after release of the obtained structure out of the apparatus 300.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device, comprising:
 providing a dielectric layer;
 providing at least one semiconductor chip comprising a first surface comprising two separate contact elements and a second surface opposite to the first surface;
 placing the semiconductor chip onto the dielectric layer with the first surface facing the dielectric layer; and
 applying an encapsulant material over the second surface of the semiconductor chip in a reel-to-reel process; wherein the dielectric layer is supported by a carrier which is removed later.

2. The method of claim 1, further comprising:
 applying the dielectric layer to a wheel before applying the encapsulant material.

3. The method of claim 1, further comprising:
 applying a stencil spacer onto the dielectric layer; and
 applying the encapsulant material over the second surface of the semiconductor chip by using the stencil spacer.

4. The method of claim 1, further comprising:
 applying the encapsulant material by use of a squeegee.

5. The method of claim 4, further comprising:
 precuring and/or curing the obtained structure after applying the encapsulant material.

6. The method of claim 1, wherein performing the reel-to-reel process includes using a first reel and a second reel and a working zone arranged between the first and second reels and that the dielectric layer is fed into the working zone by the first reel and is fed away from the working zone by the second reel, wherein the working zone comprises a wheel having a downward or upward curvature or a block having a planar surface.

7. A method of fabricating a semiconductor device, comprising:
 providing a dielectric layer;
 providing at least one semiconductor chip comprising a first surface comprising two separate contact elements and a second surface opposite to the first surface;
 placing the semiconductor chip onto the dielectric layer with the first surface facing the dielectric layer;
 applying the dielectric layer to a wheel; and
 applying an encapsulant material over the second surface of the semiconductor chip, wherein the dielectric layer is supported by a carrier which is removed later.

8. The method of claim 7, further comprising:
 applying a stencil spacer onto the dielectric layer; and
 applying the encapsulant material over the second surface of the semiconductor chip by using a stencil printing process.

9. The method of claim 7, further comprising:
 applying the encapsulant material by use of a squeegee.

10. The method of claim 7, further comprising:
 precuring and/or curing of the obtained structure after applying the encapsulant material.

11. A method of fabricating a semiconductor device, comprising:
 providing a dielectric layer applied with a stencil spacer;
 providing at least one semiconductor chip comprising a first surface comprising two separate contact elements and a second surface opposite to the first surface;
 placing the semiconductor chip onto the dielectric layer with the first surface facing the dielectric layer; and
 applying an encapsulant material over the second surface of the semiconductor chip by using the stencil spacer for planarizing the encapsulant material, and using a reel-to-reel process to apply the encapsulant material, including performing the reel-to-reel process by using a first reel and a second reel and a working zone arranged between the first and second reels and that the dielectric layer is fed into the working zone by the first reel and is fed away from the working zone by the second reel, and wherein the working zone comprises a wheel having a downward or upward curvature or a block having a planar surface; wherein the dielectric layer is supported by a carrier which is removed later.

12. The method of claim 11, further comprising:
 precuring and/or curing the obtained structure after applying the encapsulant material.

13. The method of claim 11, further comprising:
applying the dielectric layer to a wheel before applying the encapsulant material.

14. The method of claim 11, further comprising:
applying the encapsulant material by use of a squeegee.

15. The method of claim 11, further comprising:
applying the stencil layer to the dielectric layer as a mold foil.

16. The method of claim 15, further comprising:
applying the mold foil in a reel-to-reel process.

17. A method of fabricating a semiconductor device, comprising:
providing a dielectric layer;
providing at least one semiconductor chip comprising a first surface comprising two separate contact elements and a second surface opposite to the first surface;
placing the semiconductor chip onto the dielectric layer with the first surface facing the dielectric layer; and
applying an encapsulant material over the second surface of the semiconductor chip by use of a squeegee, and using a reel-to-reel process, including performing the reel-to-reel process by using a first reel and a second reel and a working zone arranged between the first and second reels and that the dielectric layer is fed into the working zone by the first reel and is fed away from the working zone by the second reel, and
wherein the working zone comprises a wheel having a downward or upward curvature or a block having a planar surface;
wherein the dielectric layer is supported by a carrier which is removed later.

18. The method of claim 17, further comprising:
applying a stencil spacer onto the dielectric layer.

19. A method of fabricating a semiconductor device, comprising:
providing a dielectric layer;
providing at least one semiconductor chip comprising a first surface comprising two separate contact elements and a second surface opposite to the first surface;
placing the semiconductor chip onto the dielectric layer with the first surface facing the dielectric layer;
applying a dam onto the dielectric layer; and
applying an encapsulant material over the second surface of the semiconductor chip,
wherein a reel-to-reel process is used to apply the encapsulant material,
wherein the reel-to-reel process is performed by using a first reel and a second reel and a working zone arranged between the first and second reels and that the dielectric layer is fed into the working zone by the first reel and is fed away from the working zone by the second reel, and
wherein the working zone comprises a wheel having a downward or upward curvature or a block having a planar surface;
wherein the dielectric layer is supported by a carrier which is removed later.

* * * * *